United States Patent
Schmidig (10) Patent No.: US 11,668,774 B2
(45) Date of Patent: Jun. 6, 2023

(54) SAMPLE EXTENSION ON THE SAMPLING HEAD SIDE TO REDUCE THE $B_0$ FIELD DISTURBANCE AT THE END OF THE SAMPLE TUBE

(71) Applicant: Bruker Switzerland AG, Fällanden (CH)

(72) Inventor: Daniel Schmidig, Schaffhausen (CH)

(*) Notice: Subject to any disclaimer, the term of this patent is extended or adjusted under 35 U.S.C. 154(b) by 0 days.

(21) Appl. No.: 17/904,654

(22) PCT Filed: Jan. 29, 2021

(86) PCT No.: PCT/EP2021/052064
§ 371 (c)(1),
(2) Date: Aug. 19, 2022

(87) PCT Pub. No.: WO2021/165014
PCT Pub. Date: Aug. 26, 2021

(65) Prior Publication Data
US 2023/0094745 A1  Mar. 30, 2023

(30) Foreign Application Priority Data
Feb. 21, 2020 (DE) .................... 10 2020 202 243.7

(51) Int. Cl.
*G01R 33/31* (2006.01)
(52) U.S. Cl.
CPC .................. *G01R 33/31* (2013.01)
(58) Field of Classification Search
CPC ...................................... G01R 33/31
See application file for complete search history.

(56) References Cited

U.S. PATENT DOCUMENTS

| 4,365,199 A | 12/1982 | McNair |
| 5,545,994 A | 8/1996 | Barbara |

(Continued)

FOREIGN PATENT DOCUMENTS

| EP | 1995603 A1 | 11/2008 |
| JP | 2008020401 A | 1/2008 |

OTHER PUBLICATIONS

Wilmad-Lab Glass, "Doty Susceptibility-Matched Sample Plugs for High Resolution Liquids NMR", https://sp-wilmadlabglass.com/wp-content/uploads/2019/12/NMR_Sample_Devices.pdf (2019).

*Primary Examiner* — G. M. A Hyder
(74) *Attorney, Agent, or Firm* — Benoit & Côté Inc.

(57) ABSTRACT

An NMR apparatus having a magnet system for generating a homogeneous static magnetic field $B_0$ along a z direction, with a sampling head (1) comprising an RF transmitting and receiving coil system (2) and an opening (3) extending in the z direction for receiving a sample tube (4) containing a sample substance to be analyzed by means of NMR measurement, a compensation element (5) being present which at least partially compensates for disturbances in the homogeneous magnetic field $B_0$ due to the sample substance and the material of the sample tube at the sample end of the sample tube that protrudes farthest into the sampling head during measuring operation, is characterized in that the compensation element is arranged outside the sample tube protruding into the sampling head during measuring operation of the NMR apparatus and in the z direction below the sample end, and is mounted so as to be movable, in particular displaceable, in the z direction. Thus, the compensation element can nestle against the sample tube during operation without problem. In this way, the susceptibility jump and the resulting $B_0$ field disturbance in the lower region of the NMR-active sample liquid caused by the lower (Continued)

end of the sample tube are effectively minimizable with particularly uncomplicated technical means.

12 Claims, 4 Drawing Sheets

(56) References Cited

U.S. PATENT DOCUMENTS

| | | |
|---|---|---|
| 5,684,401 A | 11/1997 | Peck et al. |
| 6,563,317 B2 | 5/2003 | Warden et al. |
| 7,514,922 B2 | 4/2009 | Freytag |
| 9,500,726 B2 | 11/2016 | Baumann |
| 2007/0188174 A1* | 8/2007 | Tanaka ............ G01R 33/34046 324/318 |
| 2009/0295389 A1 | 12/2009 | Pruessmann et al. |

* cited by examiner

Fig. 4a          Fig. 4b ated shape and made of an appropriate material can be positioned in the sample tube in such a way that it is at a sufficiently large distance in the z direction from the measurement volume between the RF coils.

SAMPLE EXTENSION ON THE SAMPLING HEAD SIDE TO REDUCE THE $B_0$ FIELD DISTURBANCE AT THE END OF THE SAMPLE TUBE

The invention relates to an NMR apparatus having a magnet system for generating a homogeneous static magnetic field $B_0$ along a z direction, with a sampling head comprising an RF transmitting and receiving coil system and an opening extending in the z direction for receiving a sample tube containing a sample substance to be analyzed by means of NMR measurement, a compensation element being present which at least partially compensates for disturbances in the homogeneous magnetic field $B_0$ due to the sample substance and the material of the sample tube at the sample end of the sample tube that protrudes farthest into the sampling head during measuring operation.

Such an NMR apparatus has become known from U.S. Pat. No. 4,365,199 A (=reference [1]).

BACKGROUND OF THE INVENTION

The present invention deals generally with the field of nuclear magnetic resonance ("NMR"), in particular with sampling heads for NMR devices. NMR spectroscopy is a powerful method of instrumental analysis, in particular for analyzing sample compositions or for determining the structure of substances in samples.

The measuring substance is typically poured in solid or liquid form into an essentially cylindrical sample tube and brought into the NMR sampling head for measurement. There, the measuring sample is exposed to a strong, static magnetic field $B_0$, which is homogeneous in a z direction resulting in the alignment of nuclear spins in the measuring substance of the sample. For this purpose, orthogonal high-frequency electromagnetic pulses are then radiated into the sample in the x or y direction. The development over time of these nuclear spins in turn produces high-frequency electromagnetic fields, which are detected in the NMR apparatus. Information regarding the properties of the sample is integrally obtainable from the detected HF fields over a certain physical range. In particular, the chemical composition and the chemical bonding behaviors in the sample is inferable from the position and intensity of NMR lines; see e.g. U.S. Pat. No. 9,500,726 B2≈DE 10 2013 204 131 B3 (=reference [2]).

The problem is a jump in susceptibility at the lower axial end of the sample tube which occurs due to the transition between the sample substance or the material of the sample tube and the spatial region underneath in the z direction, which region is usually suffused with a temperature control fluid. This jump in susceptibility, due to the finite axial length of the sample tube, causes a disturbance of the homogeneous magnetic field $B_0$ in the NMR system.

Extended Immersion Depth

In many cases, the sample tube is simply positioned in the z direction in such a way that the disturbance of the $B_0$ field due to the susceptibility jump at the sample end is far enough away from the active measurement volume of the sample so that this $B_0$ field disturbance is correctable using a shim system.

For example, U.S. Pat. No. 6,563,317 B2≈EP 1 239 296 B1∓DE 101 11 672 C2 (=reference [3]) describe a device for the precise centering of an NMR sample receptacle, in which the sample tube inserted into the NMR sampling head for measurement at its bottom end hits a fixed stop that is at a sufficiently large distance in the z direction from the measurement volume that is located in the region between the RF coils.

The disadvantage here is, of course, that a specific, significantly larger amount of sample material is required which does not provide any NMR signal at all and is only used to extend the sample in the z direction.

Compensation Plug

Another possibility for avoiding a disturbance of the $B_0$ field due to the susceptibility jump at the sample end is to choose the material of the sample tube so that the susceptibility of the tube material corresponds to the susceptibility of the sample liquid. The lower part of the sample tube is then filled with this material instead of with sample liquid. In addition, a plug made of an appropriate material is also usable over the surface of the sample liquid.

Such sample tubes with stoppers are available from Wilmad-Lab Glass http://www.wilmad-labglass.com (=Reference [4]) as "Doty Susceptibility-Matched Sample Plugs for High Resolution Liquids NMR."

The disadvantage here, however, is the relatively complex handling of these so-called compensation plugs. This is because they have to be inserted by hand separately for each sample tube.

Specially Shaped End of the Sample Tube

Another possibility to reduce a disturbance of the $B_0$ field by the susceptibility jump at the sample end can be to shape the end of the sample tube (i.e. the glass at the axial end of the sample tube) in such a way that the magnetic disturbance of the $B_0$ field is minimized.

However, the disturbance caused by the sample end cannot normally be completely eliminated in this way. In addition, each sample tube has to be individually shaped, which is a complex process. The desired shape is only approximately achievable.

Controlling the Susceptibility of the Sample Tube to Fluids

U.S. Pat. No. 5,545,994 A (=reference [5]) suggests, as a possibility of reducing the disturbance of the $B_0$ field in the NMR spectrometer due to the susceptibility of the sample tube, bringing the entire outwardly effective susceptibility of the sample tube to a certain desired value using suitable fluids that flow around the sample tube. Of course, this requires a considerable outlay in terms of equipment for the fluid supply and discharge as well as constant, sensitive control in the NMR operation. In addition, such fluids are too expensive for use in temperature control.

Electronic Control of the Susceptibility of the Sample Tube

A completely different approach, as proposed in U.S. 5,684,401 A (=reference [6]), provides for a controlling to compensate for the disturbance of the homogeneous magnetic field $B_0$ by the sample tube. The RF receiving coil system is to be modified in such a way that parallel windings of micro-coils are regulated in such a way that the magnetic field around the sample tube is approximately homogeneous. This then has to be electronically regulated to a desired value during measuring operation, which of course requires a certain amount of effort and is also subject to disturbances in long-term operation.

Use of a Compensation Element in the Sample Tube

Above cited reference [1] describes an arrangement having the features mentioned above. A generic arrangement similar to reference [1] is also known from U.S. Pat. No. 7,514,922 B2≈EP 1 909 111 B1 DE 10 2006 046 888 B4 (=reference [7]). From reference [1]) it emerges that a compensation element in the form of a cylindrical, rodshaped insert is to be inserted into the sample tube prior to the NMR measurement. This insert may also comprise two plugs which are axially spaced apart from one another, similar to that proposed in reference [4].

However, the compensation element according to reference [1] is not designed to compensate for a disturbance of the $B_0$ field due to the susceptibility jump at the sample end. The document does not deal with this problem at all. Rather, the compensation element according to reference [1] is intended to reduce temperature fluctuations in the sample tube and distribute the generated heat more evenly.

Problem Addressed by the Invention

In view of this, the problem addressed by the present invention is that of improving an NMR apparatus of the type described at the outset using the simplest technical means possible so as to avoid the above-discussed disadvantages of known, generic arrangements. In particular, the present invention is intended to minimize the susceptibility jump or the $B_0$ field disturbance in the lower region of the NMR-active sample liquid, caused by the lower end of the sample tube.

BRIEF DESCRIPTION OF THE INVENTION

This object, which is relatively demanding when viewed in detail, is achieved by the present invention in an equally surprisingly simple and inexpensive but very effective manner by the compensation element being arranged on the one hand outside the sample tube protruding into the sampling head during measuring operation of the NMR apparatus and on the other hand in the z direction below the sample end, and the compensation element being mounted so as to be movable, in particular displaceable, in the z direction.

In this way, the compensation element can easily nestle against the sample tube during operation. This allows the main idea of the present invention, namely an axial continuation of the susceptibility of the sample tube filled with the substance to be measured from its end in the z direction further down, i.e. a kind of "artificial axial extension" of the sample tube with regard to its susceptibility, to be realized in a manner that is particularly sensitive and individually tailored to different sample geometries. As a result, the $B_0$ field disturbance is actually pushed downward in the z direction, i.e. further away from the active NMR region of the RF coil system, due to the normally always quite "abrupt" axial sample end, which ultimately also leads to better performance of the NMR apparatus, especially in an experiment for the suppression of the NMR signal from the solvent. Different resonance frequencies, relaxation times or self-diffusion coefficients are used.

Compared to the prior art, for example according to references [1] and [4], in which the compensation element must be applied within the sample tube before each NMR measurement, the present invention proposes to place the compensation element spatially outside the sample tube. This significantly simplifies the entire handling. There is also no need for specially designed sample tubes and, moreover, the sample substance is not touched and therefore is not impaired.

Another essential difference between the present invention and the known devices is, according to the invention, the prescribed arrangement of the compensation element in the z direction below the end of the specimen. There, the compensation element is either fixedly or movably insertable into the structure of the sampling head in this region and in any case no longer stands in the way.

Of course, as in the prior art, the compensation element in the invention must be magnetically adapted to the susceptibility at the axial end of the sample tube, preferably also taking into account the susceptibility of the sample substance in this region, in order to compensate for the susceptibility jump at the sample end and thereby completely or at least largely avoid disturbances of the $B_0$ field in the NMR spectrometer.

Preferred Embodiments and Developments of the Invention

A class of embodiments of the NMR apparatus according to the invention is very particularly preferred in which the compensation element is designed in such a way that it continues the cross-sectional geometry of the sample tube in the z direction. This allows the jump in susceptibility at the sample end to be compensated to a particularly large extent. Typical sample tubes have a circular cross section. Preferred compensation elements have them with the same diameter.

Additionally or alternatively, in further embodiments of the invention (not specifically shown in the drawing) the compensation element is configurable in such a way that the sample tube rests on the compensation element only at one point on the z axis during measuring operation. In this way, the frictional resistance between the sample tube and the compensation element is minimized, which is advantageous for rotating the sample in a measuring process.

Also advantageous are embodiments of the invention in which the compensation element is designed in such a way that its contour conforms geometrically to the contour of the sample tube at the sample end. In particular, the sample tube at the sample end is configurable as a hemisphere, and the compensation element in its portion opposite the sample tube is configurable as a hemispherical shell.

Further advantageous embodiments of the invention are characterized in that the compensation element is formed from a material, or is coated therewith, which minimizes the frictional resistance between the compensation element and the sample tube which is in contact therewith during the measuring operation, in particular polytetrafluoroethylene or a ceramic alloy, the material preferably having a mean susceptibility x between 0.4 cgs and 0.8 cgs.

Embodiments of the NMR apparatus according to the invention are also particularly preferred which are characterized in that the compensation element is designed so as to allow a fluid flow, preferably a temperature control gas flow, from the compensation element into an annular gap between the outer shell of the sample tube protruding into the sampling head during measuring operation and a wall element of the sampling head surrounding the sample tube in this position which in particular carries the RF transmitting and receiving coil system, and hinders this flow as little as possible.

A sampling head for an NMR apparatus according to the invention of the type described above also falls within the scope of the present invention.

As is typically the case, the NMR sampling head includes a measuring sample chamber which receives a measuring sample during operation and may optionally be made of a material having low thermal conductivity (for example, glass, quartz, Teflon, etc.). The sampling head comprises a first transmitting/receiving coil which surrounds the measuring sample chamber or is surrounded by it. The measuring head preferably also comprises a network for tuning different resonance frequencies on a first transmitting/receiving coil.

Furthermore, the sampling head may optionally also comprise a second transmitting/receiving coil, which can be matched to further measuring cores, for example the lock frequency. In other embodiments, the measuring head comprises a further measuring sample with a substance that is detected by a second or third transmitting/receiving coil and is used as a reference signal for the lock.

A very particularly preferred class of embodiments of the NMR sampling head designed and arranged according to the invention in the NMR apparatus is characterized in that the compensation element is mounted on an air cushion, which is preferably formed by a temperature control gas flow in the sampling head.

Alternatively or in addition, in another embodiment, the compensation element can be mounted on a spring device acting in the direction of the z axis. Here, too, a temperature control fluid may flow around the compensation element and the sample tube, and typically this is also implemented.

Additionally or alternatively, in further embodiments of the NMR sampling head according to the invention, the compensation element may be mounted so as to be freely rotatable about the z axis, so that it can rotate with the sample tube in particular during measuring operation.

In any case, the compensation element should be implemented in the sampling head in such a way that rotation of the sample tube about its z axis is not impeded or prevented at all.

In general, the compensation element designed according to the invention can be solid or hollow. The increased stability and simpler manufacturability of the compensation element in the first case contrasts with a not inconsiderable savings of material and, thus, also weight in the latter case.

The NMR sampling head according to the invention is preferably designed in such a way that the compensation element is protected against uncontrolled removal from the sampling head. This can in particular be brought about by a retaining element which is firmly connected to the sampling head and engages in the compensation element.

In further preferred embodiments of the invention, there is an upper axial stop for the compensation element in the sampling head in the z direction, so that the compensation element cannot accidentally fly out of the sampling head.

Further developments of the embodiments described above, in which the compensation element is designed so that a fluid flow into an annular gap between the outer shell of the sample tube protruding into the sampling head during measuring operation and a wall element of the sampling head surrounding the sample tube in this position is hindered by the compensation element as little as possible, are advantageously characterized in that the compensation element has fluid passages, in particular gas passages, in particular on its outside in the form of longitudinal grooves parallel to the z direction and/or on the z axis in the form of an axial through-hole.

In practice, embodiments of the NMR sampling head according to the invention in which the compensation element has a susceptibility x that is typically between the average susceptibility of the sample tube and a typical susceptibility of the sample substance have proven themselves, preferably a susceptibility x between 0.3 cgs and 1 cgs, in particular a susceptibility x between 0.4 cgs and 0.8 cgs. Typical solvents often mixed with the material of the sample substance are, for example, acetone with a susceptibility X=0.46 cgs or glycerol with a susceptibility X=0.78 cgs.

Finally, a class of embodiments of the invention is particularly preferred in which the NMR sampling head is characterized in that the compensation element with susceptibility X in the sampling head is designed to be exchangeable for another compensation element having a different susceptibility X'. In this way, a particularly sensitive and effective susceptibility adjustment can be accomplished, and thus disturbances of the $B_0$ field in the NMR spectrometer are completely or at least largely preventable.

Further advantages of the invention may be found in the specification and the drawings. Likewise, the features according to the invention that are mentioned above and set out in the following can each be used individually per se or together in any desired combinations. The embodiments shown and described are not to be understood as an exhaustive list but instead are of an exemplary nature for describing the invention.

DETAILED DESCRIPTION OF THE INVENTION AND THE DRAWINGS

The invention is illustrated in the drawings and is explained in more detail with reference to exemplary embodiments.

FIGS. 1 to 4b of the drawing each show, in schematic views with different details, preferred embodiments of the NMR apparatus according to the invention in the region of the sampling head.

Such an NMR apparatus with a magnet system, not specifically shown in the drawing for reasons of clarity, for generating a homogeneous static magnetic field $B_0$ along a z direction comprises a sampling head 1; 1', which has an RF transmitting and receiving coil system 2 and an opening 3 extending in the z direction for receiving a sample tube 4, which, during operation, contains a sample substance to be examined by means of NMR measurement, a compensation element 5; 5'; 5"; 5'" being present which at least partially compensates for disturbances of the homogeneous magnetic field $B_0$ due to the sample substance and the material of the sample tube 4 at the axial sample end of the sample tube 4 protruding farthest into the sampling head 1 during measuring operation.

The NMR apparatus according to the invention is distinguished from the known arrangements according to the prior art in that the compensation element 5; 5'; 5"; 5''' is arranged outside of the sample tube 4 protruding into the sampling head 1; 1' in the measuring operation of the NMR apparatus and in the z direction below the sample end.

Figure 1:
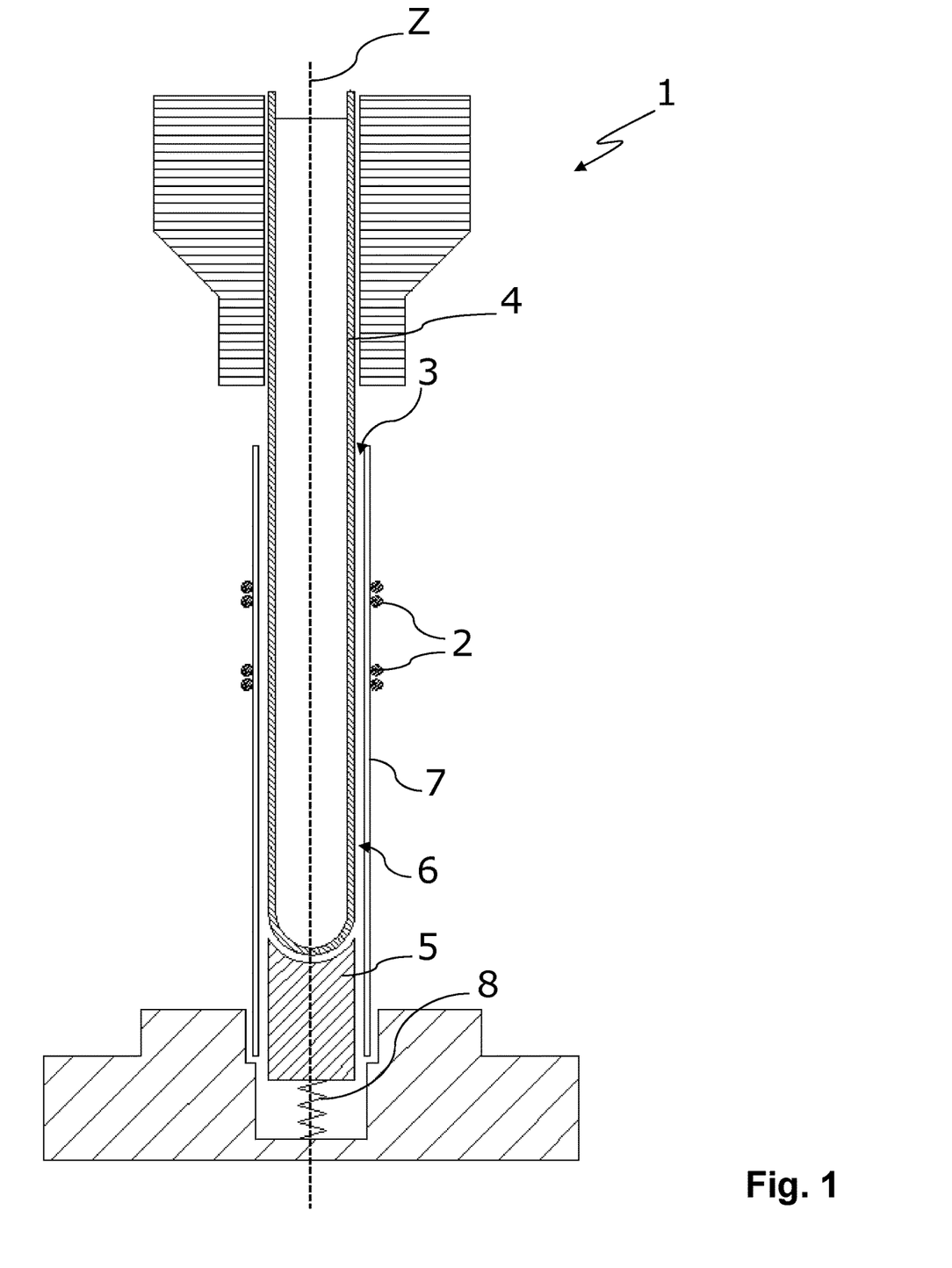
FIG. 1 is a schematic vertical sectional view of a first embodiment of the sampling head for an NMR apparatus according to the invention having a compensation element that is movably mounted on a spring device acting in the direction of the z axis.

In FIG. 1 a preferred embodiment of the sampling head 1 is arranged within the NMR apparatus according to the invention. The sampling head comprises a compensation element 5 which is designed in such a way that it continues the cross-sectional geometry of the sample tube 4 in the z direction, its contour nestling against the contour of the sample tube 4 at the sample end. At its axial end, the sample tube 4 is spherical and the compensation element 5 in its portion opposite the sample tube 4 is designed as a spherical cap, in particular as a hemispherical shell.

The outer radius of the spherical end of the sample tube is advantageously smaller than the inner radius of the spherical cap of the compensation element. In this way, a punctiform contact between the compensation element and the sample tube is achievable. When the sample tube rotates within the sampling head, the friction with respect to the compensation element is reduced, the contours of the sample tube and compensation element still nestling against one another. This design is particularly well-suited for a compensation element that is rigidly integrated into parts of the sampling head.

Furthermore, the compensation element 5 is designed in such a way that a fluid flow, for example a temperature control gas flow, from the compensation element 5 into an annular gap 6 between the outer shell of the sample tube 4 protruding into the sampling head 1 during measuring operation and a wall element 7 of the sampling head 1 surrounding the sample tube 4 in this position, which in particular carries the RF transmitting and receiving coil system 2, is hindered as little as possible.

The compensation element 5 is movable, in particular displaceable, in the z direction, and is mounted on a spring device 8 acting in the direction of the z axis. Contrary to the drawing, the compensation element is to be pressed against the sample tube by the spring device in order to leave as small a gap as possible here. The compensation element is rotatably mounted with the spring device 8 in order to impede a rotation of the sample tube as little as possible during an NMR measurement. In addition, it is designed to be exchangeable for another compensation element having a different susceptibility.

Figure 2:
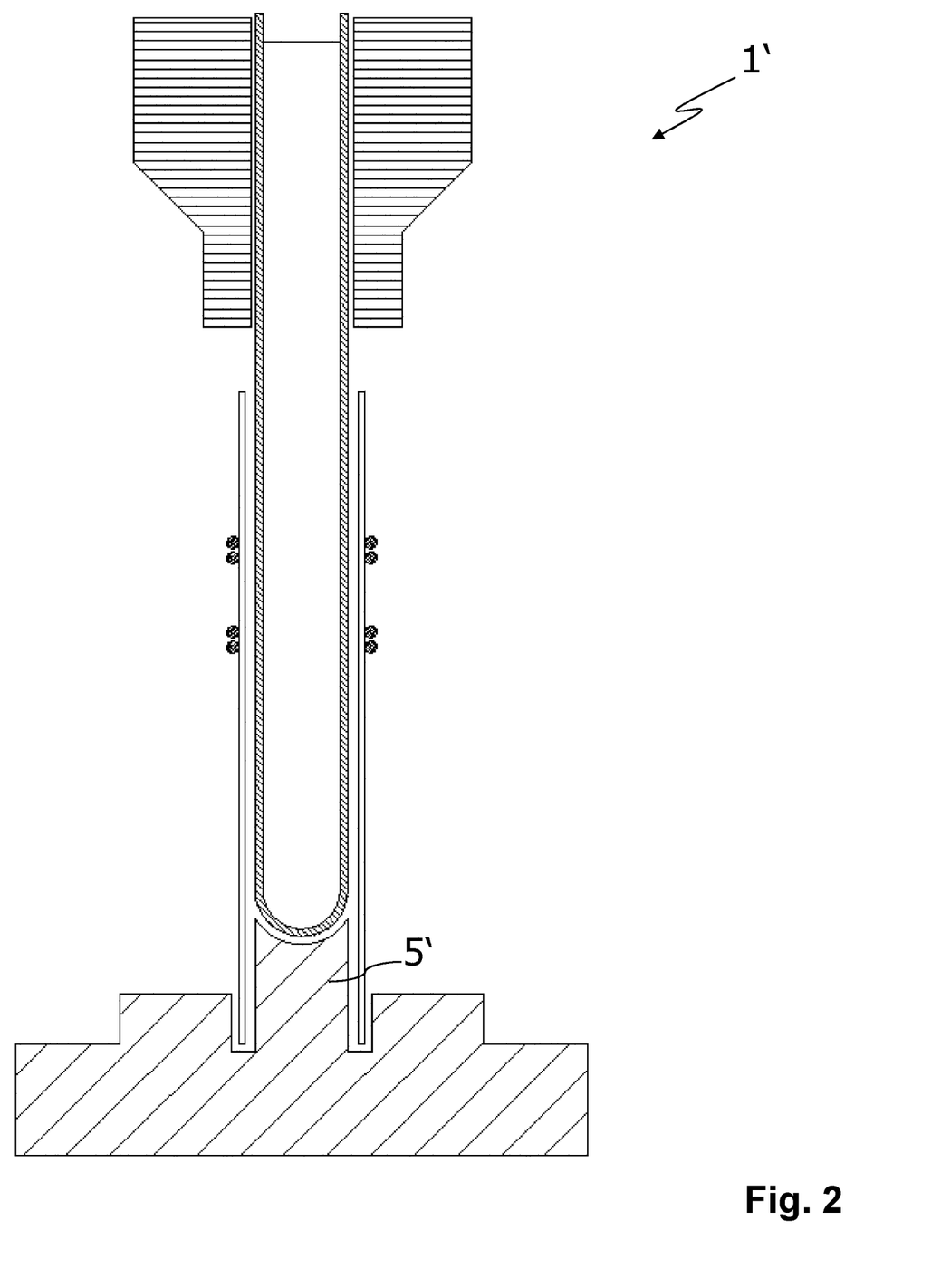
FIG. 2 shows an NMR sampling head as in FIG. 1, but in a simpler embodiment, with a rigid compensation element acting as a stop for the sample tube in the direction of the z axis and integrated into the sampling head.

Another, particularly simple embodiment of the invention is shown schematically in FIG. 2. The sampling head 1' shown there is similar in most features to the sampling head 1 shown in FIG. 1, but it differs therefrom by the different design of its compensation element 5':

In this embodiment, namely, the compensation element 5' is rigidly integrated into parts of the sampling head 1' in the relevant lower axial region and is simply not movably supported. However, in this case the sample tube 4 is mountable on an air cushion above the compensation element 5', which is preferably formed by a flow of temperature control gas in the sampling head 1.

Figure 3A:
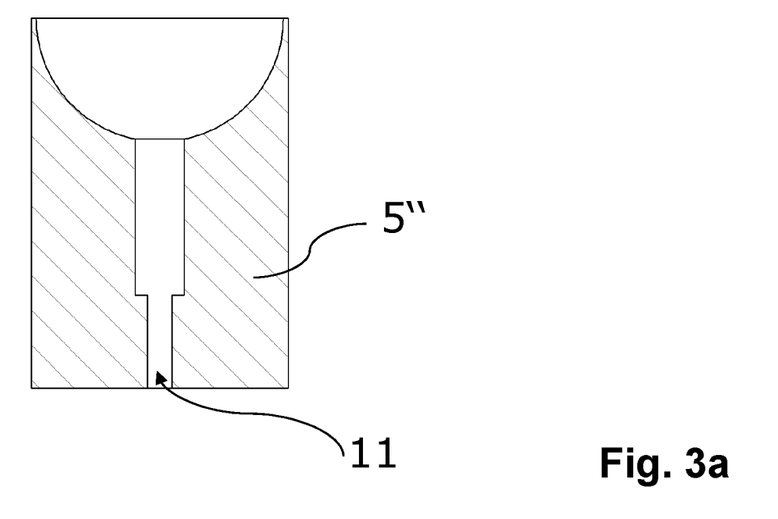
FIG. 3a is a very schematic vertical section through an embodiment of the compensation element provided according to the invention with gas passages parallel to the z direction.
Figure 3B:
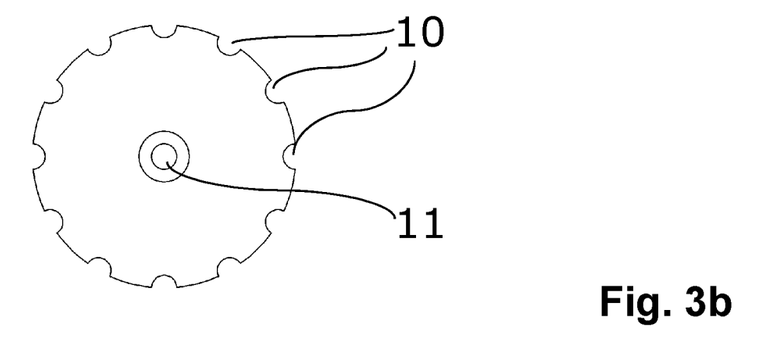
FIG. 3b is a schematic horizontal section through an embodiment of the compensation element according to FIG. 3a with fine longitudinal grooves on the outside parallel to the z direction and with an axial through-hole.
Figure 3C:
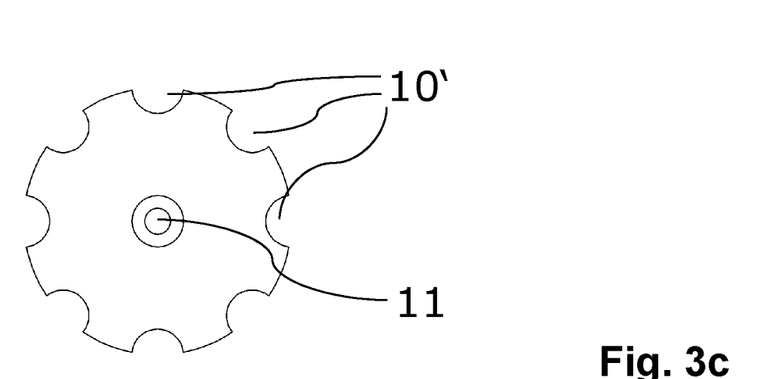
FIG. 3c is a schematic horizontal section through an embodiment of the compensation element similar to that shown in FIG. 3b, but with coarser longitudinal grooves.

FIGS. 3a to 3c show exemplary embodiments in greater detail in which the compensation element 5" has fluid passages, namely in particular on its outside in the form of longitudinal grooves 10; 10' parallel to the z direction and on the z axis in the form of an axial through-hole 11. FIG. 3b shows the cross section of a compensation element perpendicular to the z direction with finer longitudinal grooves 10 on the outside that are parallel to the z direction, while somewhat coarser longitudinal grooves 10' are present in the exemplary embodiment according to FIG. 3c.

Figure 4A:
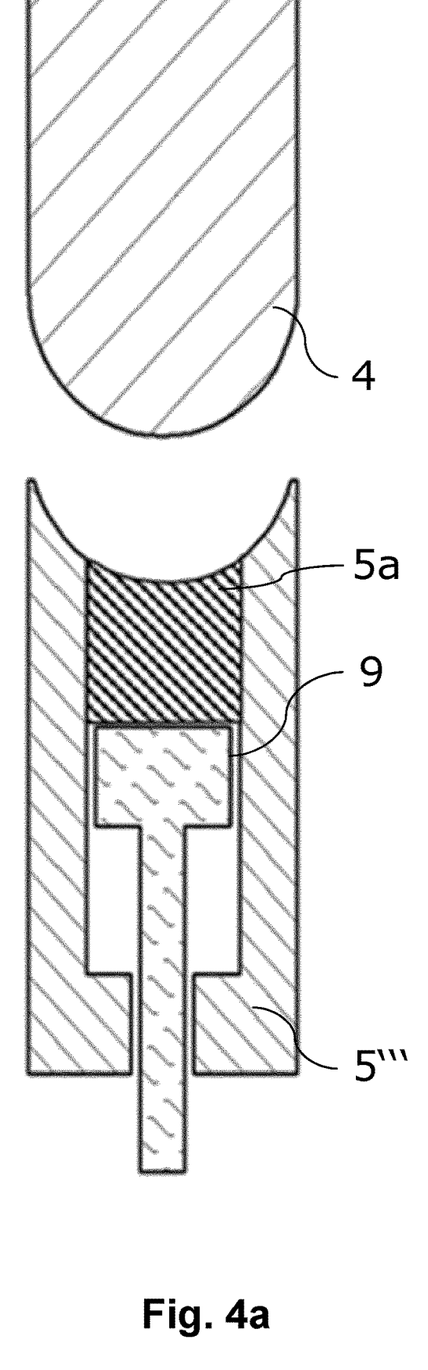
FIG. 4a is a schematic vertical section through an embodiment of the compensation element provided according to the invention with a retaining element firmly connected to the sampling head and engaging in the compensation element in a central z-position.
Figure 4B:
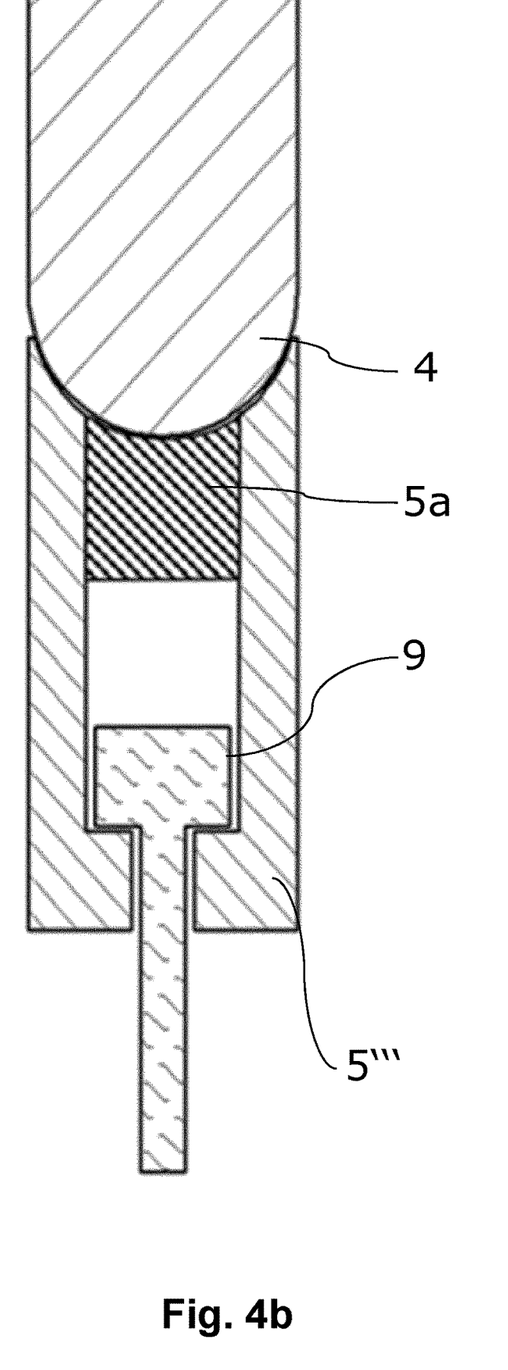
FIG. 4b shows the compensation element from FIG. 4a, but with the retaining element in a z position just in front of the stop.

Finally, FIGS. 4a and 4b show an embodiment of a compensation element 5''' arranged according to the invention in the NMR sampling head axially below the sample tube 4, which compensation element is hollow and protected against uncontrolled removal from the sampling head by a retaining element 9 firmly connected to the sampling head 5''' and engaging in the compensation element. As a result, there is also an upper stop in the z direction for the compensation element 5'''. The compensation element is advantageously pressed in the direction of the sample tube by a spring or the fluid flow of a temperature control gas.

In order to compensate even better for the magnetic field distortion due to the jump in susceptibility at the lower end of the sample tube 4, it is possible in the case of a hollow compensation element 5''', as a rule after the mounting element 9 has been installed, to also insert a plug 5a made of the same material as the compensation element 5''' into the opening facing the sample tube 4.

While in the schematic vertical section according to FIG. 4a the compensation element 5''' axially movable in the z direction is shown in a central z position relative to the retaining element 9, which is firmly connected to the sampling head and engages in the hollow compensation element 5''', FIG. 4b shows the compensation element 5''' relative to the retaining element 9 in a z position just in front of the axial stop in order to minimize the friction with the retaining element firmly connected to the sampling head when the sample tube 4 rotates.

The features of all the above-described embodiments of the invention may also be combined with one another at least in most cases.

LIST OF REFERENCE SIGNS z z axis of the arrangement
1; 1' NMR sampling head
2 RF transmission and reception coil system
3 opening extending in the z direction
4 sample tube
5; 5'; 5"; 5''' compensation element
5a plug
6 annular gap
7 surrounding wall element
8 spring device
9 retaining element
10; 10' longitudinal grooves
11 axial through-hole

LIST OF REFERENCES

Documents taken into consideration for the assessment of patentability
[1] U.S. Pat. No. 4,365,199 A
[2] U.S. Pat. No. 9,500,726 B2 ≈DE 10 2013 204 131 B3
[3] U.S. 6,563,317 B2≈EP 1 239 296 B1≈DE 101 11 672 C2
[4] http://www.wilmad-labglass.com
[5] U.S. Pat. No. 5,545,994 A
[6] U.S. Pat. No. 5,684,401 A
[7] U.S. Pat. No. 7,514,922 B2≈EP 1 909 111 B1 ≈DE 10 2006 046 888 B4

The invention claimed is:
1. A sampling head for an NMR apparatus comprising:
an RF transmission and reception coil system;

an opening extending in a z direction for receiving a sample tube containing a sample substance to be analyzed by means of NMR measurement; and a compensation element which at least partially compensates for disturbances of a homogeneous magnetic field $B_0$ due to the sample substance and a material of the sample tube at a sampling end of the sample tube protruding into the sampling head during a measuring operation, the compensation element being arranged outside the sample tube and protruding into the sampling head during the measuring operation and in the z direction below the sampling end, and being movably mounted in the z direction on a spring device acting in the direction of the z axis or on an air cushion formed by a flow of temperature control gas in the sampling head.

2. The sampling head according to claim 1, wherein the compensation element is mounted so as to be freely rotatable about the z axis and is able to rotate with the sample tube during the measuring operation.

3. The sampling head according to claim 1, wherein the compensation element is hollow and is protected against uncontrolled removal from the sampling head by being firmly attached via a retaining element to the sampling head.

4. The sampling head according to claim 1, wherein an upper stop for the compensation element is provided in the sampling head in the z direction.

5. The sampling head according to claim 1, wherein the compensation element has gas passages on its outside in the form of longitudinal grooves parallel to the z direction and/or on the z axis in the form of an axial through-hole.

6. The sampling head according to claim 1, wherein the compensation element has a susceptibility X which is between an average susceptibility of the sample tube and a typical susceptibility of the sample substance.

7. The sampling head according to claim 1, wherein the compensation element has a susceptibility X and is configured to be exchangeable for another compensation element with a different susceptibility X'.

8. An NMR apparatus having a magnet system for generating homogeneous static magnetic field $B_0$ along a z direction, and comprising a sampling head according to claim 1.

9. The NMR apparatus according to claim 8, wherein the compensation element is configured to continue the cross-sectional geometry of the sample tube in the z direction.

10. The NMR apparatus according to claim 8, wherein the compensation element has a contour that clings to a contour of the sample tube at the sampling end, wherein the sampling end of the sampling tube has a hemispherical shape and a portion of the compensation element opposite the sample tube is shaped like a hemispherical shell.

11. The NMR apparatus according to claim 8, wherein the compensation element is formed from or coated with a material which minimizes a frictional resistance between the compensation element and the sample tube resting against it during the measuring operation, the material having an average susceptibility X between 0.4 cgs and 0.8 cgs.

12. The NMR apparatus according to claim 8, wherein the compensation element is configured to allow a fluid flow of temperature control gas from the compensation element into an annular gap between an outer shell of the sample tube protruding into the sampling head during the measuring operation and a wall element surrounding the sample tube, which carries the RF transmitting and receiving coil system.

* * * * *